(12) United States Patent
Chin et al.

(10) Patent No.: US 6,630,669 B1
(45) Date of Patent: Oct. 7, 2003

(54) CORRELATED MODULATION IMAGING (CMI)

(75) Inventors: Ken K. Chin, Pine Brook, NJ (US); Haijiang Ou, Harrison, NJ (US)

(73) Assignee: CF Technologies, Inc., Pine Brook, NJ (US)

( * ) Notice: Subject to any disclaimer, the term of this patent is extended or adjusted under 35 U.S.C. 154(b) by 0 days.

(21) Appl. No.: 09/536,856

(22) Filed: Mar. 28, 2000

(51) Int. Cl.$^7$ ................................................. G02F 1/01
(52) U.S. Cl. ........................ 250/330; 250/334; 341/162
(58) Field of Search ................................ 250/330, 334; 341/155, 162, 172

(56) References Cited

U.S. PATENT DOCUMENTS

| | | | |
|---|---|---|---|
| 3,918,060 A | * 11/1975 | ALpers | 343/7.3 |
| 5,376,936 A | * 12/1994 | Kerth et al. | 341/150 |
| 6,166,676 A | * 12/2000 | Iizuka | 341/172 |

* cited by examiner

Primary Examiner—Huy Mai

(57) ABSTRACT

In the present invention of Correlated Modulation Imaging (CMI), the weak optical image signal (and therefore the signal current) is modulated, and the signal integration direction is correlated to the modulation. Therefore, the dark and/or background current, which are not modulated, are cancelled, while the signal current is integrated. As a result, the total integration time of the signal of each pixel is increased, and its signal to noise ratio and dynamic range are improved. Besides, the CMI noise spectrum peaks at the modulation frequency, and therefore, the detector's 1/f and other low frequency noises can be suppressed. In the present invention, the method and theory of CMI, as well as the means and steps for the realization of CMI, are explicitly developed. Two versions of CMOS devices (CMI unit pre-amplifier version 1 and 3), with their circuitry design and testing data are presented as the critical component for correlated modulation imaging. A prototype chip of the CMI circuitries has been fabricated by the MOSIS 0.5-micron foundry. SPICE circuitry simulation has demonstrated the functioning of CMI unit pre-amplifier version 1 and 3 as designed. Experimental work has demonstrated the functioning of CMI unit pre-amplifier version 1 as designed, as well as the key features of CMI—increase of integration time, and improvement of signal to noise ratio and dynamic range.

2 Claims, 9 Drawing Sheets

CORRELATED MODULATION IMAGING (CMI)

BACKGROUND OF THE INVENTION

1. Field of the Invention

This invention relates to a new method of electronic imaging and its applications. The invention particularly relates to a new imaging method of focal plane arrays (FPA), in which the image signal is modulated while the background and/or dark current are not modulated, and the image signal integration is correlated to its modulation.

2. Description of Related Art

By using intersubband transition, the quantum well infrared photodetectors (QWIP) operating in photoconductor (PC) mode are made of wide-bandgap materials, such as GaAs/AlGaAs. The maturity of GaAs material growth and its processing technology places the QWIP in a strategically important position. Large-sized (512×512 or greater), multi-color, reliable, reproducible, and low-cost QWIP FPAs working in the important 8–14$\mu$ long wavelength infrared (LWIR) atmospheric window seem to be within reach for military, scientific, and commercial applications. However, the effort to develop a competitive LWIR QWIP FPA is still being challenged by QWIP's one impediment: its large dark current. In order to get significant IR response, the PC mode QWIP must be biased at a few volts, which leads to a large dark current due to electron thermal emission, thus making it difficult for its use at T>60 K when the wavelength $\lambda$>8$\mu$. Although the 8–12$\mu$ QWIP's dark current has been reduced and responsivity increased through innovative designs, it still cannot operate at the convenient liquid nitrogen temperature of 77 K to perform the critically important 8–12 micron thermal imaging.

Note that the condition of $$I_d \text{ or } I_b \gg I_s \quad (1)$$

exists in other cases, too. In a recent NASA research project, the 15$\mu$ QWIP's dark current (working at 55 K) $I_d$ is three orders greater than the scene or signal current $I_s$. In solar magnetography, the background photocurrent $I_b$ is more than four orders greater than $I_s$. In long wavelength IR spectroscopy and spectroscopic imaging, the narrow bandwidth of signal mandates a low ratio of $I_s/I_d$. All these three cases, as well as other scientific and biomedical imaging and spectroscopic applications involving weak signals, have the same feature as the QWIP FPA. The conventional staring array imaging method cannot perform satisfactorily, since its signal integration time is limited by the predominant dark or background current. As the background current $I_b$ plays an equivalent role as the dark current $I_d$, only $I_d$ is used in the following discussion. Since imaging and spectroscopy share the same signal integration and readout technology, we use the terminology of FPA imaging, which can be applied to both cases.

To deal with the difficulties of imaging a weak signal with presence of a strong background or dark current, the concept of current memory background subtraction (CMBS) was proposed by the Jet Propulsion Laboratory (JPL) Group of Advanced Imager and Focal Plane Technology. The photodetector's large dark current is subtracted by a current sink, which was memorized during the FPA's calibration phase. The result is an increase of effective dynamic range by one order, albeit at the cost of increased shot noise.

Note that in the case of a single photodetector recovering weak optical signal from strong noise, the method of lock-in amplification was invented. In lock-in amplification, a weak signal is modulated together with a strong noise, which mainly consists of the white shot noise and the 1/f flick noise. After going through an amplifier with a bandwidth centered at the modulation frequency, and a band pass filter to maintain the modulated signal while eliminating unwanted noises at frequencies different from the modulation frequency, the modulated signal is fed to a phase sensitive detector (PSD). As a unit square wave multiplier in phase with the modulator, the PSD feeds a DC component, which is proportional to the modulated signal amplitude, to a low pass filter. When the noise is pure white noise, the resulting improvement of the signal to noise ratio due to lock-in amplification is $$\frac{(S/N)_o}{(S/N)_i} = \sqrt{\frac{B_{LPF}}{B_{WN}}} \quad (2)$$

where $(S/N)_i$ is the input signal to noise ratio, $(S/N)_o$ the output signal to noise ratio, $B_{LPF}$ the bandwidth of the low pass filter, and $B_{WN}$ the bandwidth of the original white noise.

It is interesting to note that although the lock-in amplification and the CMI presented in this invention both utilize the modulation of signal, the two methods are different. The lock-in amplifier works only for a single detector, while the correlated modulation imaging technique does for an array of detectors (one-dimensional linear array or two-dimensional -area array). The single photodetector with lock-in amplification operates continuously, with a phase sensitive detector and a low pass filter as the key components. In the method of CMI, the improvement of signal to noise ratio is achieved due to the modulation of signal and correlated multi-cycle integration of the signal, with the increase of total integration time as the key factor.

BRIEF DESCRIPTION OF THE SYMBOLS AND DRAWINGS

Definition of Symbols $I_s$ DC image signal photocurrent generated in the detector by the scene of imaging. $I_s$ is defined as the average of the real image signal current $i_s$, which is time varying, through its integration cycle.

$I_d$ DC dark current thermally generated. $I_d$ is defined as the average of the time-varying real dark current $i_d$.

$I_b$ DC background current, which is generated by photons of the same wavelengths under detection. As $I_s$ and $I_d$, $I_b$ is defined as the average of the time varying real background current $i_b$. When $I_b$ can be modulated separately from signal current $I_s$, the background current $I_b$ plays the same role as the dark current $I_d$. In this invention, we treat the two as equivalent, using $I_d$ to denote $I_b+I_d$.

$T_i$ Integration time. For CMI, $T_i=m\tau$, where m is the number of integration cycles of the CMI unit pre-amplifier, and $\tau$ the period of each cycle.

R Signal to noise ratio, defined as $$R = \text{Signal/Noise} = \frac{N_s}{\sqrt{\overline{n^2}}},$$

where $N_s$ is the number of electrons due to the signal current $I_s$, and $\overline{n^2}$ is the root mean square value of the total number of electrons due to random noise.

D Dynamic range in decibels, defined as D=20 log$_{10}$ R$_{max}$, when the maximum integration time is utilized.

f Frequency.

a) Angular frequency. ω=2πf

ω$_m$ Modulation frequency. ω$_m$=2πf$_m$=2π/τ.

T(ω) Noise transmission function of a conventional single cycle integrator for a conventional FPA T(ω)=√V$_o$(ω,φ)V$_o$*(ω,φ), where V$_o$(ω,φ) is the output voltage of the integrator with a unit harmonic current i(t)=e$^{j(ωt+φ)}$ as the input.

T$_m$ (ω) Noise transmission function of a CMI unit pre-amplifier version 1 for a CMI FPA

LIST OF FIGURES

FIG. 1 is The Principles of the Method of Correlated Modulation Imaging (CMI)

a. CMI with passive modulator b. CMI with active modulator c. Unit cell readout circuit FIG. 2 is Relative Noise Power Spectra of Integrators Solid Curve: T$_m^2$(ω) of a CMI unit pre-amplifier used in CMI FPA Dashed Curve: T$^2$(ω) of a single cycle integrator used in a conventional FPA (Total integration time for both cases: T$_i$=10 ms; modulation frequency f$_m$=1 KHz)

OBJECTS OF THE INVENTION

An object of the invention is the provision of a new method—correlated modulation imaging (CMI)—and the steps and means to realize the method for the detection of weak image signals buried in strong background.

A further object of the invention is the provision of two versions of circuit designs for the performance of the CMI unit pre-amplifier.

DETAILED DESCRIPTION OF THE INVENTION

During the course of this description, like numbers will be used to identify like elements according to different figures which illustrate the invention.

1. The Principles of the Method of CMI

Figure 1:
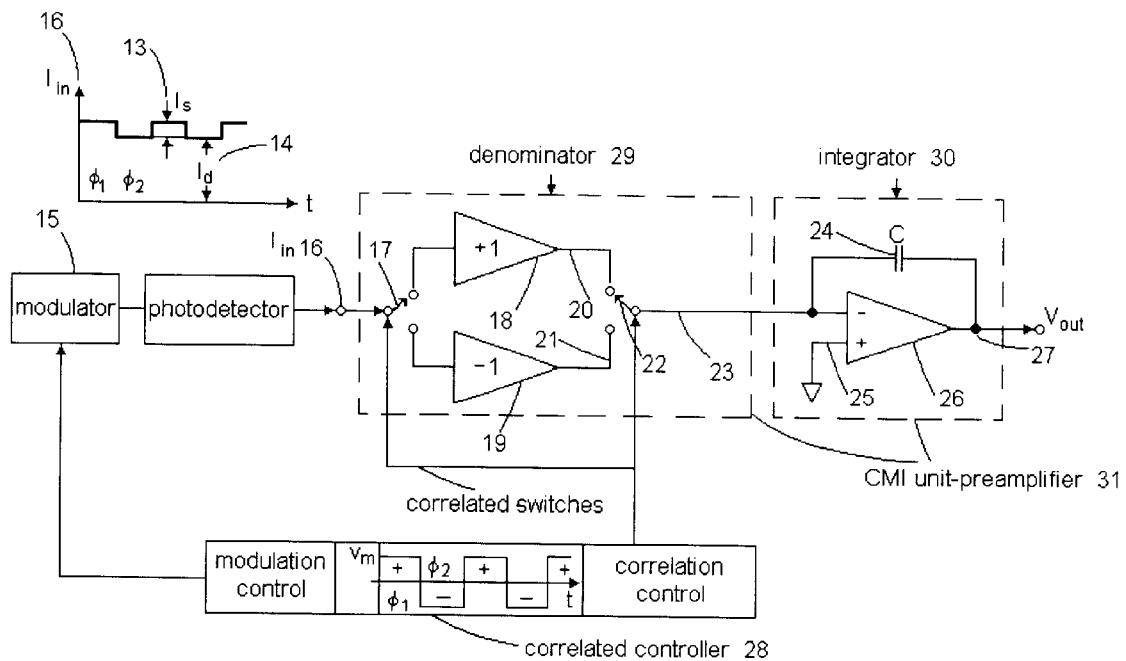

The schematic of the CMI method is shown in FIGS. 1(a, b, and c). Object 10, which can be a person, a scene, a device, or any other object for imaging, reflects or emits light. The light coming from object 10 is focused by using a lens system 12 to form an image on the focal plane array (FPA) 13, which is composed of a one-dimensional or two-dimensional array of pixels or unit cells 32. For a two-dimensional CMI focal plane array, lens system 12 is stationary. For a one-dimensional CMI focal plane array, lens system 12 with a rotating mirror can be used.

Each unit cell is a photodetector (also named as detector) 16, which is connected to its CMI unit pre-amplifier 31 composed of demodulator 29 and integrator 30. The signal photocurrent I$_s$ is generated in detector 16 by the light from a corresponding area of object 10. In addition to signal current I$_s$, there are also background current I$_b$ generated by background illumination 14 and/or dark current I$_d$ due to detector leakage. I$_b$ and I$_d$ are independent from signal current I$_s$, and play the same role. In the following discussion I$_b$ is used to represent the effects of both I$_b$ and I$_d$.

In the method of correlated modulation imaging (CMI), the signal current is modulated, while the background and/or dark current are not modulated. Two methods can be used to modulate the signal current—by using a passive modulator (FIG. 1a) or an active modulator (FIG. 1b). The most widely used passive modulator 11 is a mechanical chopper or electro-optic switch, which is placed in the pathway between object 10 and FPA 13. The most widely used active modulator is a pulsed laser 15 that illuminates object 10. Passive modulator 11 or active modulator 15 of the FPA 13, as well as all the unit pre-amplifiers (31) of the FPA 13, are controlled by the same correlated controller 28.

The sum of the modulated signal current I$_s$ and the unmodulated background and/or dark current I$_d$ is 17, or I$_{in}$, which corresponds to a unit cell 32 of FPA 13, is fed to its corresponding demodulator 29. The function of demodulator 29 is to offer correlated switch 22 that controls the direction of 17, or I$_{in}$. After passing switch 22, by using integrator 30, I$_{in}$ is integrated on 24, an integration or charge storage capacitor C. The voltage accumulated on 24 is 27, or the output voltage V$_{out}$, which is fed to a standard amplifier through a standard bus controlled by a standard shift register used in conventional FPA's.

In phase one (φ1 in FIG. 1c) input current I$_{in}$ (17) is the signal photocurrent I$_s$ plus the background (due to unmodulated background illumination 14) and/or dark current I$_d$ (generated by detector 16 without any illumination). In phase two (φ2), there is no signal current I$_s$. In the case of passive modulation, object 10 is blocked by modulator 11. In the case of active modulation, object 10 does not emit any light since active modulator or pulsed laser 15 does not illuminate object 10. Therefore, I$_{in}$=I$_d$. In CMI, the modulation frequency of correlated controller 28 is selected so that in each cycle of CMI the charge storage capacitor 24 of the integrator 30 is charged only to a portion of the saturation level. Discharged by the dark current I$_d$ repeatedly, capacitor 24 is saved for the integration of signal current I$_s$. Thus, C or the charge storage capacitor 24 is not saturated quickly, but reserved for the integration of signal current I$_s$.

2. The Theory or Theoretical Advantages of CMI a. Improvement of FPA Sensitivity and Dynamic Range (Subtraction of DC Dark Current and Increase of Integration Time)

The sensitivity of a-semiconductor photodetector is characterized by its signal to noise ratio R defined as $$R = \text{Signal/Noise} = \frac{N_s}{\sqrt{n_{ro}^2 + n_{1/f}^2 + n_{th}^2 + n_s^2 + n_d^2}} \quad (3)$$

where N$_s$ is the number of integrated photoelectrons generated by a steady signal photon flux, and the denominator is the root mean square (rms) value of the total number of noise electrons. The noise electrons are from various sources. $\overline{n_{ro}^2}$ is the noise due to readout electronics, $\overline{n_{1/f^2}}$ the 1/f or low frequency noise mostly associated with the fabrication process of the photodetector, $\overline{n_{th}^2}$ the detector thermal noise, and $n_s^2$ and $\overline{n_d^2}$ the shot noises associated with the steady signal and dark currents, respectively. When the dark current (DC) is several orders higher than the signal current (DC), the shot noise $n_d^2$ associated with the DC dark current may be predominant among all the components of the noise electrons. Therefore, Eq (3) can be simplified as $$R = \text{Signal/Noise} \approx \frac{N_s}{\sqrt{n_d^2}} = \frac{N_s}{\sqrt{N_d}} = \frac{I_s}{\sqrt{eI_d}}\sqrt{T_i} \quad (4)$$

where $N_d$ is the number of integrated electrons due to the DC dark current $I_d$, e the electron charge, $T_i$ the signal integration time (approximately equal to the frame period for a staring FPA). Here we use the equation $$\overline{n_d^2} = N_d = \frac{I_d T_i}{e} \quad (5)$$

which is valid for photovoltaic detectors. If the detectors are photoconductors, such as QWIP's, the rms value $$\sqrt{\overline{n_d^2}}$$

of dark current generated shot noise electrons as expressed by Eq. (5) will be multiplied by a factor of square root of 2. Other equations in the following discussion will be modified with a similar factor of correction, which does not affect substantially our conclusions concerning the method of CMI.

It is readily seen that the signal to noise ratio is proportional to the square root of the total integration time $T_i$ of each pixel. However, $T_i$ is limited by $N_{sat}$, the saturation or maximum number of electrons that an integration capacitor can handle. Note that $N_{sat}$ is limited by two factors. First, the capacitance of the signal integration capacitor can only be made in the range of pF due to real estate limit in the FPA; secondly, the increase of the capacitance will induce a higher kTC noise. For a conventional FPA of a single-cycle signal integration, where the capacitance trans-impedance amplifier (CTIA) is the most widely used readout interface, $$T_i = \frac{eN_{sat}}{I_s + I_d} \approx \frac{eN_{sat}}{I_d} \quad (6)$$

Using signal integration time defined by Eq. (6), we can obtain the optimized signal to noise ratio for a conventional FPA using CTIA $$R_{Conv,\max} = (\text{Signal/Noise})_{Conv,\max} \approx \frac{I_s}{I_d}\sqrt{N_{sat}} \quad (7)$$

In CMI, the integration of the DC dark current is self-cancelled. Therefore, the integration time $T_i$ is maximized, and so is the signal to noise ratio:

$$T_i \approx \frac{eN_{sat}}{I_s} \quad (8)$$

The maximum achievable signal to noise ratio is $$R_{CMI,\max} = (\text{Signal/Noise})_{CMI,\max} \approx \sqrt{\frac{I_s N_{sat}}{I_d}} \quad (9)$$

Note that in deriving equation (9) it is assumed that the signal integration continues during the second half of integration period when the DC dark current of the previous half period is being cancelled out. This ideal assumption cannot be realized in the case discussed here: the signal current is modulated while the dark current is not. Thus, the maximum signal to noise ratio is reduced to $$R_{CMI,\max} = \frac{1}{2}\sqrt{\frac{I_s N_{sat}}{I_d}} \quad (10)$$

As the sensitivity of image detection of an FPA is defined by

Signal/Noise=1 (11)

the weakest detectable image signal current of a FPA using the CMI method is $$(I_s/I_d)_{min,\,CMI} = 4/N_{sat} \quad (12)$$

The typical value of $N_{sat}$ being in the order of $10^6$ to $10^7$, therefore, the weakest detectable signal photocurrent $I_s$ is in the order of $10^{-6} I_d$. Compared with the weakest detectable image signal photocurrent of a FPA using the conventional single-cycle integration method $$(I_s/I_d)_{min,Conv} = \frac{1}{\sqrt{N_{sat}}} \quad (13)$$

the weakest detectable signal of CMI has an improvement of more than 3 orders.

In addition to signal to noise ratio and weakest detectable signal, another important figure of merit of a focal plane array is its dynamic range. In terms of decibels, the dynamic range D of a conventional staring FPA is $$D_{Conv} = 20\log_{10} R_{Conv,\max} = 20\log_{10}\left(\frac{I_s}{I_d}\sqrt{N_{sat}}\right) \quad (14)$$

whereas for a FPA using CMI method it is $$D_{CMI} = 20\log_{10}\left(\frac{1}{2}\sqrt{\frac{I_s N_{sat}}{I_d}}\right) \quad (15)$$

The improvement of dynamic range is $$D_{CMI} - D_{Conv} = 20\log_{10}\left(\frac{1}{2}\sqrt{\frac{I_d}{I_s}}\right) \quad (16)$$

b. Reduction of Low Frequency Noise (Spectrum of the Transmission Function of CMI Unit Pre-amplifier Peaking at $\omega_m$)

As shown in FIG. 1, in the method of CMI both the signal current (modulated) and the dark current (not modulated) are fed to the CMI unit pre-amplifier 31. The noise current generated in the detector also goes through the CMI unit pre-amplifier. To study the output noise spectrum, we consider the output voltage $V_o$ ($\omega$, $\phi$) with a unit current component i (t)=$e^{j(\omega t+\omega)}$ as the input. The correlated switching functions as a multiplier m (t), which is a harmonic function or other more complicated functions. The most widely used one is a series of square waves depicting the effect of switching:

$$m(t) = \begin{cases} 1 & k\tau < t < (k+1/2)\tau \\ -1 & (k+1/2)\tau < t < (k+1)\tau \quad k = 0, 1, \ldots, m-1 \\ 0 & \text{otherwise} \end{cases} \quad (17)$$

where $\tau$ is the period of each integration period, $f_m=1/\tau$ the frequency of modulation, m the number of cycles of modulation as well as integration.

$$T_i = m\tau \quad (18)$$

as the total integration time of the CMI unit pre-amplifier version 1. The Fourier transform of m (t) in frequency domain is given by $$M(\omega) = \frac{1}{2\pi}\int_{-\infty}^{\infty} m(t)e^{-j\omega t}dt \quad (19)$$

$$= \frac{j}{\pi\omega}\tan\left(\frac{\omega\tau}{4}\right)\sin\left(\frac{m\omega\tau}{2}\right)e^{-jm\omega\tau/2}$$

Note that m (t) can also be expressed as the inverse Fourier transform of M ($\omega$)

$$m(t) = \int_{-\infty}^{\infty} M(\omega)e^{j\omega t}d\omega \quad (20)$$

$$= \frac{j}{\pi}\int_{-\infty}^{\infty} \frac{\tan\left(\frac{\omega\tau}{4}\right)\sin\left(\frac{m\omega\tau}{2}\right)e^{j\omega(t-m\tau/2)}}{\omega}d\omega$$

Since m (t)=0 for 0>t$\geq T_i$, we can extend integration time of the input current from (0, $T_i$) to ($-\infty$, $\infty$) so that Fourier transform can be used $$V_0 = -\frac{1}{C}\int_0^{T_i} i(t)m(t)dt = -\frac{1}{C}\int_{-\infty}^{\infty} i(t)m(t)dt \quad (21)$$

where C is the capacitance of the integrator's charge storage capacitance. The output voltage for an input current $e^{j(\omega t+\phi)}$ is $$V_o(\omega, \phi) = -\frac{j}{\pi C}\int_{-\infty}^{\infty} d\varpi \frac{\tan\left(\frac{\varpi\tau}{4}\right)\sin\left(\frac{m\varpi\tau}{2}\right)}{\varpi}e^{j(\phi-m\varpi\tau/2)}\int_{-\infty}^{\infty} e^{j(\omega+\varpi)t}dt \quad (22)$$

$$= \frac{2j}{C}\frac{\tan\left(\frac{\omega T_i}{4m}\right)\sin\left(\frac{\omega T_i}{2}\right)}{\omega}e^{j(\omega T_i/2+\phi)}$$

The phase $\phi$ of the input noise current being random, we can obtain the rms value of the output voltage by averaging $V_o$ ($\omega$, $\phi$) through the phase $\phi$. Thus, the noise transmission function of the CMI unit pre-amplifier version 1 is $$T_m(\omega) = \sqrt{V_0(\omega, \phi)V_0^*(\omega, \phi)} = \frac{T_i}{C}\left|\frac{\tan\left(\frac{\omega T_i}{4m}\right)\sin\left(\frac{\omega T_i}{2}\right)}{\frac{\omega T_i}{2}}\right| \quad (23)$$

Figure 2:
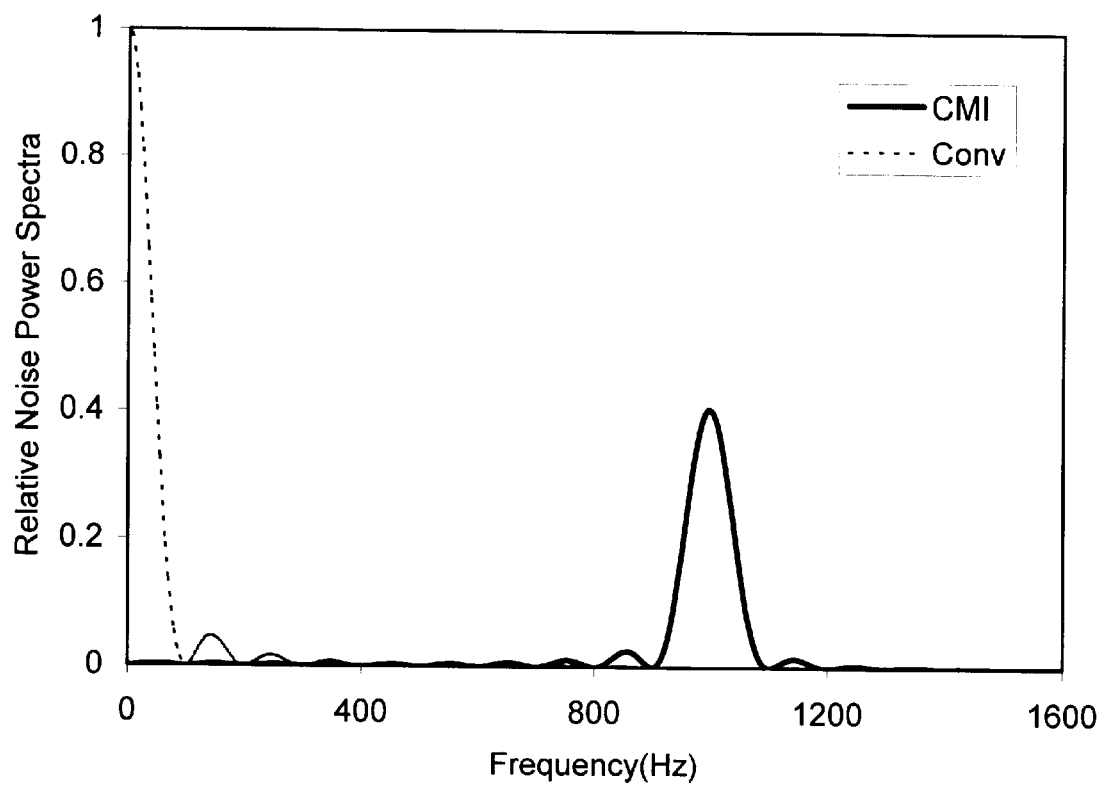

FIG. 2 shows the distribution of the spectrum of relative noise power, which is the square of the noise transmission function (23). For comparison, also shown in FIG. 2 is the square of the noise transmission function (24) of a single-cycle integrator used in a conventional FPA $$T(\omega) = \sqrt{V_0(\omega, \phi)V_0^*(\omega, \phi)} = \frac{\left|2\sin\left(\frac{\omega T_i}{2}\right)\right|}{\omega C} \quad (24)$$

To verify the results of Eq. (23) and (24), we calculate the total number of electrons due to shot noise. As a white noise, the shot noise associated with dark current $I_d$ in a photovoltaic diode has the power spectrum of $$w(f)=2eI_d \quad (25)$$

In CMI, through the total integration time Ti, the rms value of the number of shot noise electrons accumulated in the storage capacitor of the CMI unit pre-amplifier is $$\sqrt{n_d^2} = \sqrt{V_n^2}\frac{C}{e} = \frac{C}{e}\left[\int_0^{\infty} T_m^2(\omega)w(f)df\right]^{1/2} \quad (26)$$

$$= \frac{C}{e}\left[\frac{2w}{\pi C^2}\int_0^{\infty} \frac{\tan^2\left(\frac{\omega\tau}{4}\right)\sin^2\left(\frac{m\omega\tau}{2}\right)}{\omega^2}d\omega\right]^{1/2}$$

$$= \frac{C}{e}\left(\frac{wT_i}{2C^2}\right)^{1/2} = \sqrt{I_dT_i/e} = \sqrt{N_d}$$

In the case of a single cycle integrator, for the same integration time $T_i$, the rms value of the number of shot noise electrons accumulated in the storage capacitor is also $$\sqrt{n_d^2} = \sqrt{V_n^2}\frac{C}{e} = \frac{C}{e}\left[\int_0^{\infty} T^2(\omega)w(f)df\right]^{1/2} = \sqrt{I_dT_i/e} = \sqrt{N_d} \quad (27)$$

Both Eq. (26) and (27) are identical to the widely used Eq. (5). As expected, the CMI method does not reduce the total output rms value of the number of shot noise electrons, since shot noise is completely random, and not correlated with the modulation and correlated integration utilized in the CMI.

Comparing the two spectra of FIG. 2, however, we note that the transmission function T ($\omega$) of a single cycle integrator is analogous to a low pass filter with bandwidth equal to $\frac{1}{2}T_i$, while that of the CMI unit pre-amplifier is analogous to a band pass filter peaking at the center of modulation frequency $\omega_m$, with satellite windows centered at the odd harmonics of $\omega_m$. An apparent advantage of CMI then lies in its capability of suppressing the flicker or 1/f noise, which, among all the noise sources, is usually important, and even dominant for some types of widely used detectors, such as HgCdTe IR photodetectors.

Besides 1/f noise, other low frequency noises may also play important roles. For example, in solar magnetography or magnetic field imaging, the atmospheric turbulence induced transmission fluctuation has a typical cut-off frequency of 1 kHz. If the image signal modulation frequency is higher than 1 kHz, the noise due to atmospheric turbulence may be eliminated by the method of CMI.

3. The Circuit Designs of CMI

The critical component for the functioning of the method of CMI is the CMI unit pre-amplifier 31 (FIG. 1.c). Two versions of CMI unit pre-amplifier are presented in this patent filing.

Figure 3:
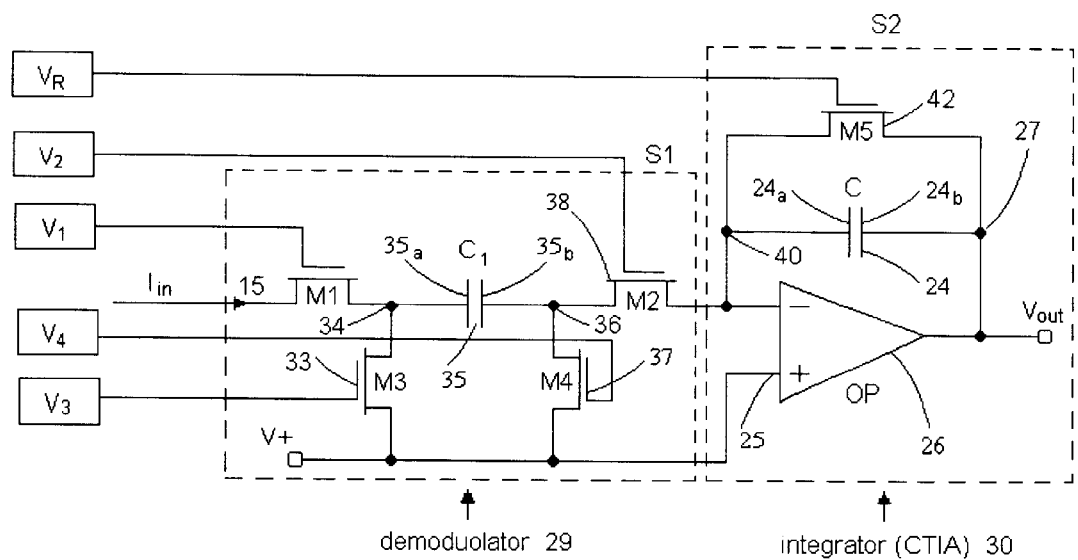
FIG. 3 is Schematic of the CMI Circuitry with CMI Unit Pre-amplifier Version 1

FIG. 3 is the first type of circuitry designed for CMI technology—CMI unit pre-amplifier version 1, which comprises two stages. The second stage S2 is integrator 30 (the same numbering as in FIG. 1.c), the capacitive transimpedance amplifier (CTIA) widely used in the readout circuit of infrared (IR) FPA's. In this stage, 41 or feedback capacitor $C_2$ of operational amplifier 43 is the main integrator, which accumulates signal throughout multi-cycle integration. 42 is the reset switch M4 enabled at beginning of integration with a narrow pulse, and reset after readout of the integrated signal. The first stage S1 is a special demodulator 29 (the same numbering as in FIG. 1.c). In this stage, 35 or capacitor $C_1$ is a temporal integrator. M1, M2, and M3 are the three MOSFET switches or gates of integrator 35. The function of this stage is to integrate input 34 or input current $I_{in}$ from detector 16 (the same numbering as FIG. 1.c), and to transfer the accumulated charges across 35a and 35b to $C_2$ with opposite polarities depending on the gate timings. When M1, M3 are off and M2 is on (Φ2 in FIG. 1.c), the input current $I_{in}$ from detector 16 is integrated on $C_1$ first. At the end of this half period of integration, by turning off M2 followed by turning on M1 and M3, the charges stored on 35b, the right plate of $C_1$ is transferred to 41a, the left plate of $C_2$. At the same time, $C_1$ is reset. Assuming that the charges stored on 35b are $Q_1$, the change of output voltage $V_o$ at node 41 after the transfer is $\Delta V_{o1}=-Q_1/Q_2$. At the next phase or half period of integration, with M1 and M2 off and M3 on (Φ1 in FIG. 1.c), input current $I_{in}$ from detector 16 charges $C_1$ and $C_2$. Assuming at the end of this period of integration the charges accumulated on 35b or the right plate of $C_1$ is $Q_2$, the change of output voltage $V_o$ at node 41 after the transfer is $\Delta V_{o2}=Q_2/C_2$. By modulating the signal current $I_s$ and not modulating the background and/or dark current $I_d$, we have $Q_i=Q_d$ and $Q_2=Q_d+Q_s$, where $Q_s$ is the integrated charge due to signal current $I_s$, and $Q_d$ the integrated charge due to background and/or dark current $I_d$. Therefore, the total change of output voltage $V_o$ at node 41 after the two consecutive integrations is $\Delta V_o=Q_s/C_2$. Note that for some type of signal modulation $\Delta V_o=2Q_s/C_2$. The function of the CMI method—integration of signal and cancellation of background—is thus fulfilled.

Figure 4:
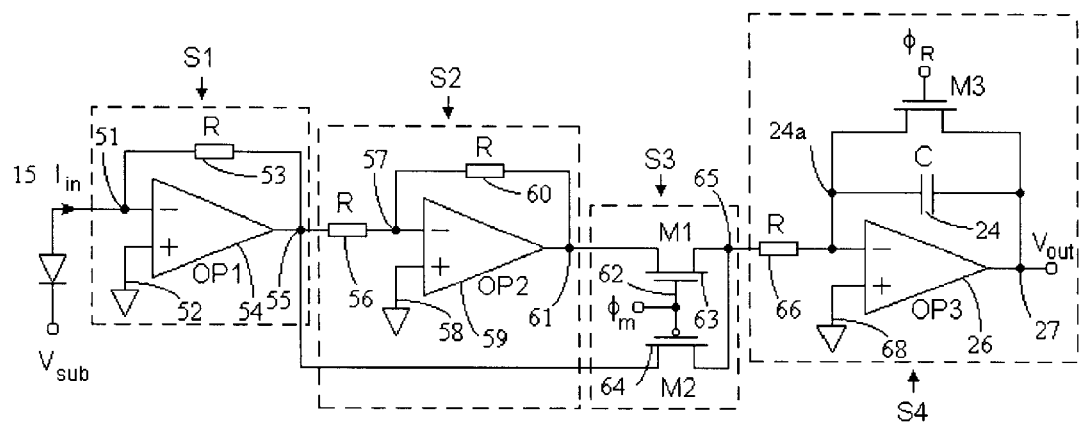
FIG. 4 is Schematic of the CMI Circuitry with CMI Unit Pre-amplifier Version 3

FIG. 4 is the second type of circuitry designed for CMI technology—CMI unit pre-amplifier version 3, which comprises four stages. The first stage S1 converts the input current $I_{in}$ of detector 50 (the same as 16 in FIG. 1.c.) to voltage. S1 is composed of 54 (an operational amplifier OP1) and 53 (a feedback resistor with resistance of R). Feedback resistor 53 is connected to output node 55 of S1 and input node 51, the negative terminal of OP1. The positive terminal of OP1 is connected to grounded node 52. The output voltage of S1 is therefore equal to $-I_{in}R$. The second stage S2 inverts the output voltage at node 55 of S1 to current. It is composed of 59 (a second operational amplifier OP2) and 56 and 60 (two resistors with equal resistance R). Since the negative input node 57 of OP2 is virtually grounded, the current passing through 56 and 60 is $-I_{in}R/R=-I_{in}$. Consequently, the output voltage of S2 at node 60 is $I_{in}R$. Controlled by the phase φ of correlated controller 28 of FIG. 1.c, the third stage S3 either passes the voltage $I_{in}R$ or the inverted voltage $-I_{in}R$ to the input of the fourth stage S4. S3 is a 2-1 multiplexer composed of 63 (an n-channel MOSFET switch M1) and 64 (a p-channel MOSFET switch M2). When Φ is high (Φ1 in FIG. 1.c), with M1 turned on and M2 turned off, voltage $I_{in}R$ passes through this stage. When Φ is low (Φ2 in FIG. 1.c), with M2 on and M1 off, voltage $-I_{in}R$ passes through this stage. The fourth stage S4 is a CTIA integrator with 71, the third operational amplifier OP3, as its main component. The input resistor 66 of S4 first turns the output voltage of S3 back to the original input current $I_{in}$, the direction of which is controlled by Φ. When Φ is high, the current $I_{in}$ flows in from 65 to 67. When Φ is low, the current $I_{in}$ flows out from 67 to 65. The reconverted current $I_{in}$ is integrated on 70, the feedback or integration capacitor C. The change of the output voltage of S4 is $$-\frac{1}{2}I_{in}\tau$$

when Φ is high, and $$\frac{1}{2}I_{in}\tau$$

when Φ is low, where τ is the period of modulation and integration. Assuming that during the first half period of τ, Φ is low, we have $I_{in}=I_d$. During the next half period of τ, with Φ turned high, $I_{in}=I_d+I_s$, where $I_d$ is the unmodulated background and/or dark current, $I_s$ the modulated signal current. The net change of output voltage $\Delta V_o$ at node 72 is $$\frac{1}{2}I_d\tau - \frac{1}{2}(I_d+I_s)\tau = -\frac{1}{2}I_s\tau$$

after one period of modulation. Note that for some type of signal modulation $$\Delta V_0 = \frac{1}{2}(I_d-I_s)\tau - \frac{1}{2}(I_d+I_s)\tau = -I_s\tau.$$

The function of the CMI method—integration of signal and cancellation of background—is thus fulfilled.

Figure 5:
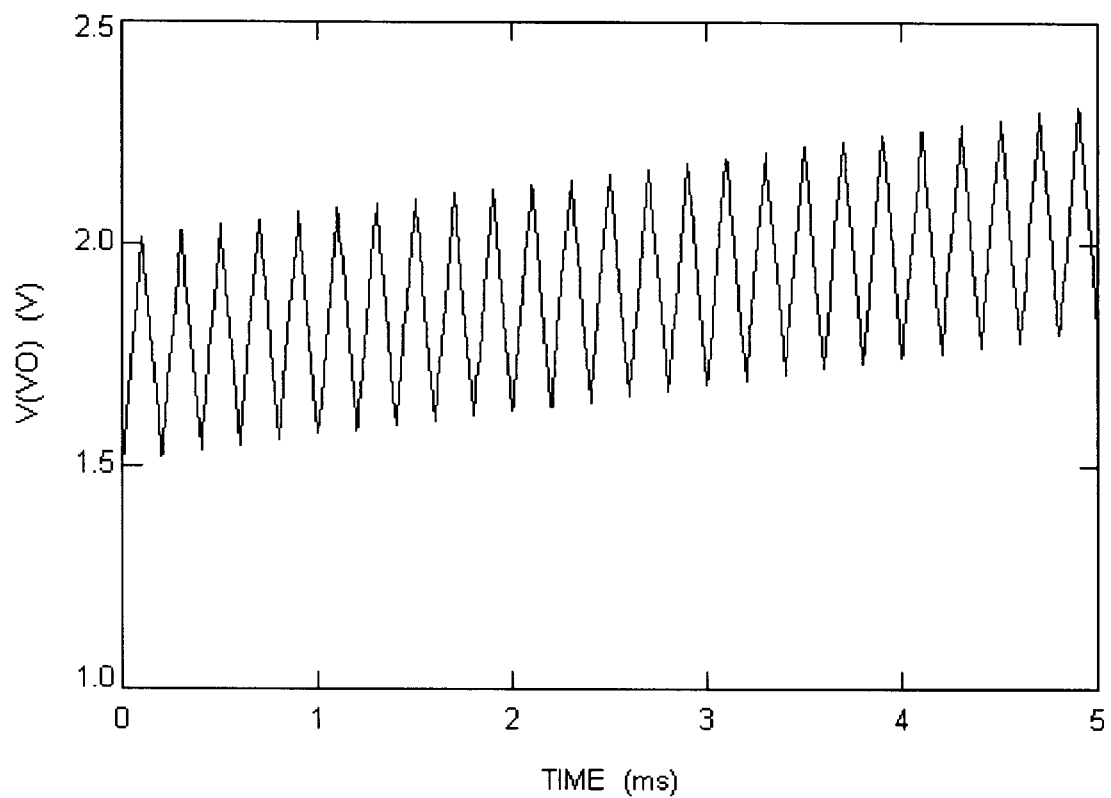
FIG. 5 is The Layout of VLSI Design of the Silicon Chip with CMI Circuitries

FIG. 5 is part of the layout of VLSI design of the silicon CMOS chip, which has various CMI circuitries, including single pixels, and linear and area arrays with multiplexers, as well as the necessary device parameter test fixtures. The figure shows one pixel of the correlated modulation imager, including both CMI unit pre-amplifier version 1 and 3. The chip was designed using HP's 0.5μ CMOS design rules, and fabricated at HP's 0.5μ CMOS facility, which was managed by the Foundry of MOSIS. A total of 20 chips sized 1 mm×1 mm were delivered and tested.

4. The Circuit Simulation of CMI

Figure 6:
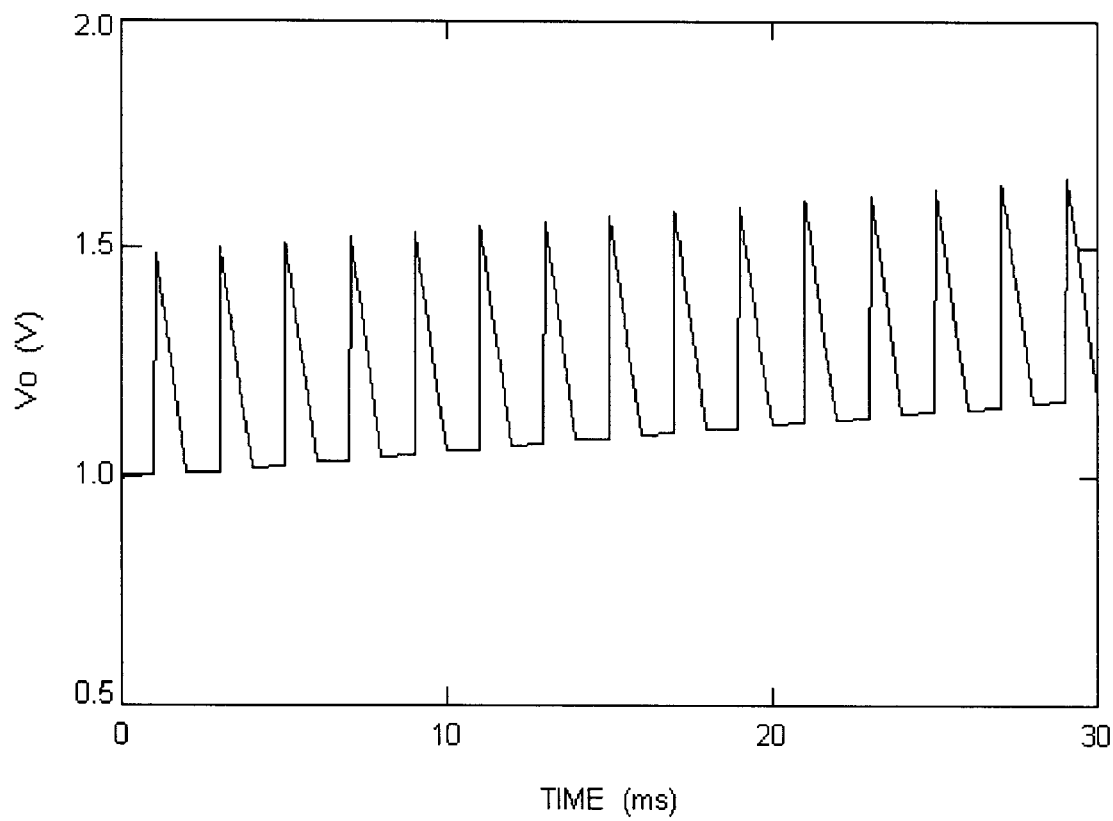
FIG. 6 is Computer Simulation Results of the CMI Unit Pre-amplifier Version 3

FIG. 6 is a computer simulation result of the CMI unit pre-amplifier version 3, by using the circuit simulation package HSPICE. 25 cycles of integration, with a total integration time of 5 ms, are shown in the figure. With the level of dark current as shown in FIG. 6, the maximum integration time will be less than 0.5 ms if a single cycle integrator is used.

Figure 7:
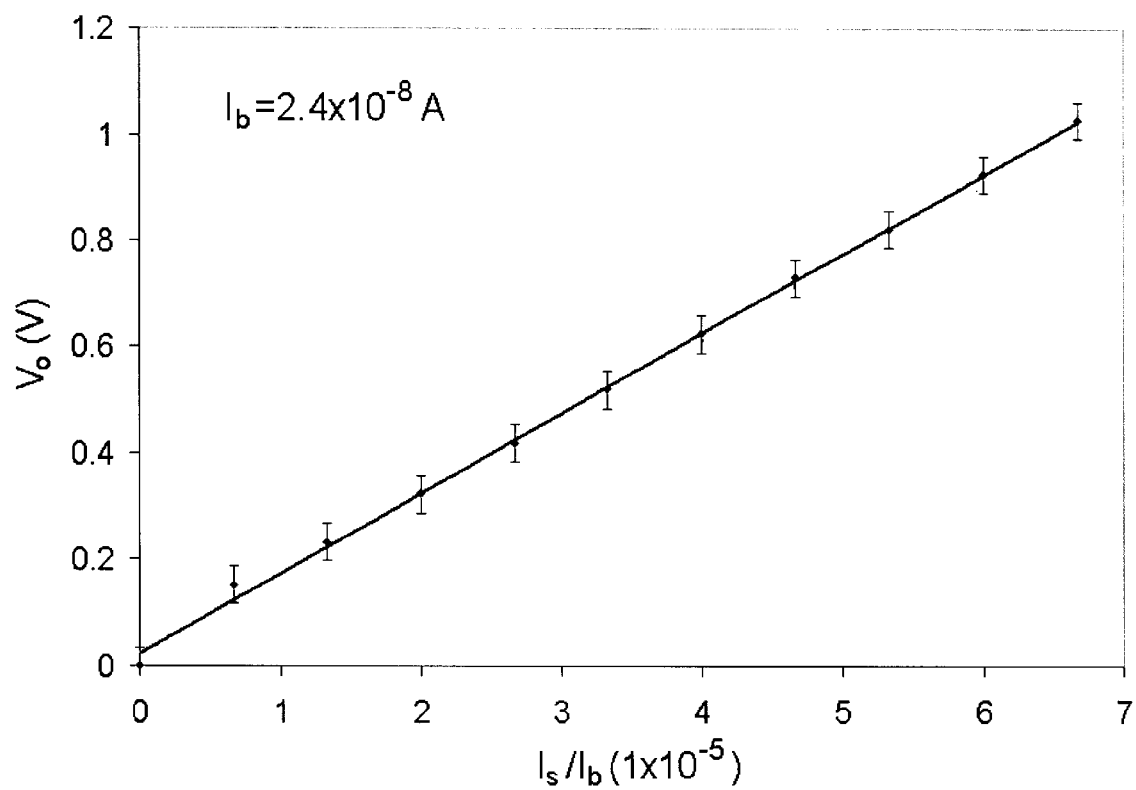
FIG. 7 is Computer Simulation Results of the CMI Unit Pre-amplifier Version 1

FIG. 7 is a computer simulation result of the CMI unit pre-amplifier version 1 by using the same circuit simulation package HSPICE. 15 cycles of integration, with a total integration time of 30 ms, are shown in the figure. During the odd number of milliseconds (1st, 3rd, 5th, . . . ), or the first phase of integration, the charge accumulation on $C_1$ due to integration of the signal current plus the dark current, as well as the charge transfer from $C_1$ to $C_2$, are shown in the plotting. During the even number of milliseconds (2nd, 4th, 6th, . . . ), or the second phase of integration, only the dark current is integrated, directly on $C_2$ and in the opposite direction. The function of correlated integration of modulated signal current and cancellation of background and/or dark current is achieved as designed.

5. The Test Results of CMI

Figure 8:
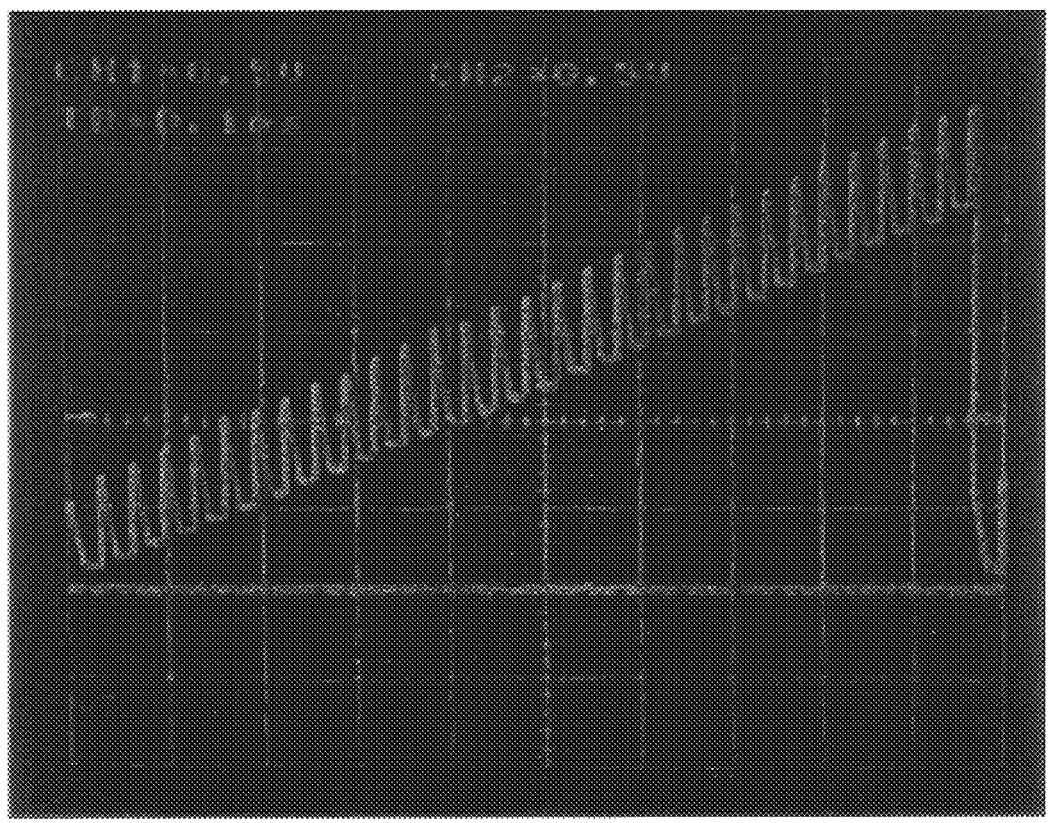
FIG. 8 is Experimental Results of the CMI Unit Pre-amplifier Version 1

FIG. 8 is experimental results of the CMI unit pre-amplifier version 1. The Pulse Instrument Focal Plane Array Test Equipment Setup is used to control the input and output of the Integrator. The modulation and correlated integration frequency of $\frac{1}{32} \times 10^6$ Hz is generated by a pulse generator. With 30 cycles, a total time of 960$\mu$s is used for integration. The data of test results were fed to a tracer. FIG. 8 is a copy of the photograph taken from the screen of the tracer. The output of the integrator of the CMI unit pre-amplifier has the same features as the simulation results shown in FIG. 7. It is therefore demonstrated experimentally that the CMI unit pre-amplifier version 1 functions as designed.

Figure 9:
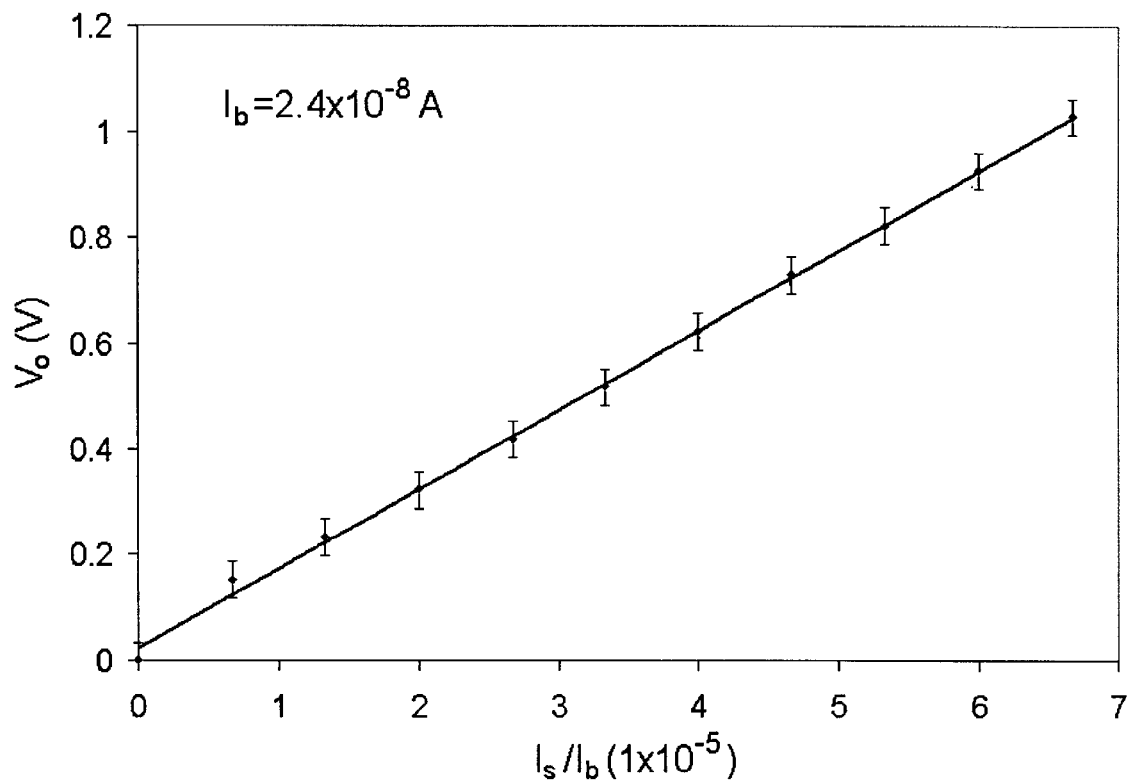
FIG. 9 is Improvement of CMI in Terms of Minimum Detectable Signal to Background Ratio

In the experimental test of the operation of correlated modulation imaging (CMI), a near infrared (NIR) light emitting diode (LED) powered by a DC source generated the background photocurrent $I_b$ of $2.4 \times 10^{-8}$ A, which was equivalent to a dark current $I_d$ in the NIR photodiode of the same magnitude. A second NIR LED, which was connected with a programmable square wave power source, generated modulated signal photocurrent $I_s$ several orders lower than $I_b$. FIG. 9 shows the CMI unit pre-amplifier version 1 output voltage $V_o$ of the NIR photodiode as a function of the input $I_s/I_d$. Note that with the measured output error bar due to random fluctuation being estimated as 0.035 V, it is obvious that the measured weakest detectable signal $I_s/I_d$ $$(I_s/I_d)_{min,CMI,Measured} < 5 \times 10^{-6} \quad (28)$$

The integration capacitor of each pixel is 2 pF, and $$N_{sat} = \frac{CV_{sat}}{e} = 3.75 \times 10^7 \quad (29)$$

in which we assume $V_{sat}$=3 V. From Equations (12) and (13), we can obtain theoretical limits of the weakest detectable signal currents for the CMI unit pre-amplifier version 1 of a correlated modulation imager (CMI) and for the single-cycle integrator of a conventional FPA, respectively.

$$(I_s/I_d)_{min,\,CMI,\,Theoretical} = 4/N_{sat} = 1.07 \times 10^{-7} \quad (30)$$

$$(I_s/I_d)_{min,Conv,Theoretical} = \frac{1}{\sqrt{N_{sat}}} = 1.63 \times 10^{-4} \quad (31)$$

A comparison of (28) and (31) shows that under the same background (or dark current), the weakest measured signal using CMI method is almost two orders smaller than the theoretical limit of the measurable signal using the conventional single-cycle integration FPA. Since signal to noise ratio and dynamic range of a FPA are directly related to its weakest detectable signal, therefore we conclude that we have experimentally demonstrated that compared to a conventional FPA, a FPA using CMI technology can improve its signal to noise ratio and dynamic range substantially. The theoretical limit of Eq. (30) was not achieved, since we used only a portion of the available saturation output voltage of 3 V to avoid the saturation, which is caused by slow drifting of CMOS device parameters and other instabilities of the electronics involved. We expect that the theoretical limit as depicted by Equation (30) will be approached if we can improve the stability and uniformity of our device and electronics, and as a result can use more cycles of integration and longer total integration time.

What is claimed is:

1. A circuit design of CMI unit pre-amplifier using one operational amplifier to perform the function of correlated modulation imaging (CMI), which is composed of
    a. a first stage S2 including an integrator (30), said integrator (30) comprising an operational amplifier (30), a feedback capacitor C (24), and a reset switch M5 (42), wherein the capacitor C (24) accumulates signal throughout multi-cycle integration, while the reset switch M5 enabled at beginning of integration with a narrow pulse, and reset after readout of the integrated signal; and
    b. a second stage S1 including a demodulator (29), said demodulator comprising a temporal integrator $C_1$ (35) and three MOSFET switches M2, M3, and M4 being gates of integrator (35);
    when M2 and M3 are off and M4 is on, an input current $I_{in}$ (15) is integrated on $C_1$ first;
    at the end of the half period of integration, by turning off M4 followed by turning on M2 and M3, the charges stored on the right plate (35b) of $C_1$, will be transferred to the left plate (24a) of C, while at the same time, $C_1$ is reset;
    assuming that the charges stored on said right plate (35b) are $Q_1$, the change of output voltage $V_o$ at node (27) after the transfer is $\Delta V_{o1} = -Q_1/C$;
    at the next phase or half period of integration, with said M3 and M4 off and M2 on, said input current $I_{in}$ charges said $C_1$ and C;
    assuming at the end of this period of integration the charges accumulated on the right plate (35b) of $C_1$ is $Q_2$, the change of output voltage $V_{out}$ at node (27) after the transfer is $\Delta V_{o2} = Q_2/C$;
    thus, the total change of output voltage $V_{out}$ at node (27) after the two consecutive integrations is $\Delta V_{out} = Q_s/C$ and the function of the CMI method, integration of signal and cancellation of background, is fulfilled.

2. A circuit design of CMI unit pre-amplifier using 3 operational amplifiers to perform the function of correlated modulation imaging (CMI), which is composed of:
    a. a first stage S1, which is composed of an operational amplifier OP1 (54) and a feedback resistor with resistance of R (53); said first stage converts an input current $I_{in}$ to voltage, and with said resistor connected to the output node and the node of the negative terminal of said OP1, the output voltage of S1 is therefore equal to $-I_{in}R$;
    b. a second stage S2, which is composed of a second operational amplifier OP2 (59) and two resistors with the same resistance R (56, 60), said second stage inverts the output voltage at node (55) of said first stage S1, and renders an output voltage of S2 at node (61) $I_{in}R$;

c. a third stage S3 controlled by the phase $\phi_m$ of a correlated controller (28), said third stage S3 including a 2-1 multiplexer composed of an n-channel MOSFET switch M1 and a p-channel MOSFET switch M2, either passes the voltage $I_{in}R$ when said $\phi_m$ is high, or the inverted voltage $-I_{in}R$ when said $\phi_m$ is low;

d. a fourth stage S4, which is a CTIA integrator, gives an output voltage of $$-\frac{1}{2}I_{in}\tau$$

when $\phi_m$ is high, and $$\frac{1}{2}I_{in}\tau$$

when $\phi_m$ is low, where $\tau$ is the period of modulation and integration, and therefore a net change of output voltage $$\Delta V_0 = \frac{1}{2}I_d\tau - \frac{1}{2}(I_d + I_s)\tau = -\frac{1}{2}I_s\tau$$

after one period of modulation, the function of the CMI method, integration of signal and cancellation of background, is thus fulfilled.

* * * * *